United States Patent
Bolowski et al.

(10) Patent No.: US 9,925,588 B2
(45) Date of Patent: Mar. 27, 2018

(54) SEMICONDUCTOR MODULE BONDING WIRE CONNECTION METHOD

(71) Applicant: Infineon Technologies AG, Neubiberg (DE)

(72) Inventors: Daniel Bolowski, Moehnsee (DE); Achim Froemelt, Warstein (DE); Christian Kersting, Paderborn (DE); Christian Stahlhut, Rinteln (DE)

(73) Assignee: Infineon Technologies AG, Neubiberg (DE)

( * ) Notice: Subject to any disclaimer, the term of this patent is extended or adjusted under 35 U.S.C. 154(b) by 235 days.

(21) Appl. No.: 14/708,964

(22) Filed: May 11, 2015

(65) Prior Publication Data
US 2015/0333034 A1 Nov. 19, 2015

(30) Foreign Application Priority Data
May 14, 2014 (DE) .......... 10 2014 106 763

(51) Int. Cl.
*B23K 1/00* (2006.01)
*B23K 1/20* (2006.01)
(Continued)

(52) U.S. Cl.
CPC .......... *B22F 1/0074* (2013.01); *B23K 1/0016* (2013.01); *B23K 1/203* (2013.01);
(Continued)

(58) Field of Classification Search
CPC ....................................................... H01L 24/83
See application file for complete search history.

(56) References Cited

U.S. PATENT DOCUMENTS

| 5,279,850 A | 1/1994 | Decrosta et al. |
| 6,660,624 B2 | 12/2003 | Tzeng et al. |

(Continued)

FOREIGN PATENT DOCUMENTS

| CN | 101241901 A | 8/2008 |
| CN | 101510537 A | 8/2009 |
| JP | 08055870 A * | 2/1996 |

OTHER PUBLICATIONS

Srikanth et al., "Effect of Wire Purity on Copper Wire Bonding," 2007 9th Electronics Packaging Technology Conference, DOI: 10.1109/EPTC.2007.4469764, Mar. 2008.*

(Continued)

*Primary Examiner* — Colin W. Slifka
(74) *Attorney, Agent, or Firm* — Murphy, Bilak & Homiller, PLLC

(57) ABSTRACT

A method includes providing a subassembly having a circuit carrier with a first metallic surface portion, a first joining partner, which is integrally connected to the first metallic surface portion by means of a first connecting layer, and a second metallic surface portion. In a heat treatment, the second metallic surface portion is held uninterruptedly at temperatures which are higher than a minimum heat-treatment temperature of at least 300° C. Moreover, a second joining partner is provided. A fixed connection is produced between the second joining partner and the subassembly in that the second joining partner is integrally connected to the subassembly following completion of the heat treatment on the second surface portion.

20 Claims, 3 Drawing Sheets

(51) Int. Cl.
    *H01L 23/00*     (2006.01)
    *B22F 1/00*     (2006.01)
    *H01L 21/00*     (2006.01)

(52) U.S. Cl.
    CPC .............. *H01L 21/00* (2013.01); *H01L 24/29* (2013.01); *H01L 24/40* (2013.01); *H01L 24/83* (2013.01); *H01L 24/85* (2013.01); *H01L 24/45* (2013.01); *H01L 24/48* (2013.01); *H01L 2224/29026* (2013.01); *H01L 2224/32225* (2013.01); *H01L 2224/40095* (2013.01); *H01L 2224/40225* (2013.01); *H01L 2224/45124* (2013.01); *H01L 2224/45147* (2013.01); *H01L 2224/48091* (2013.01); *H01L 2224/48227* (2013.01); *H01L 2224/48472* (2013.01); *H01L 2224/73265* (2013.01); *H01L 2224/83065* (2013.01); *H01L 2224/8384* (2013.01); *H01L 2224/83359* (2013.01); *H01L 2224/92246* (2013.01); *H01L 2224/92247* (2013.01); *H01L 2924/00014* (2013.01); *H01L 2924/01029* (2013.01); *H01L 2924/13055* (2013.01); *H01L 2924/13091* (2013.01); *H01L 2924/19107* (2013.01)

(56) References Cited

U.S. PATENT DOCUMENTS

2009/0206456 A1*   8/2009   Guth ................... H01L 23/3735
                                                                                257/666
2013/0049204 A1*   2/2013   Oeschler ................ H01L 24/29
                                                                                257/772

OTHER PUBLICATIONS

Aoh et al., "Thermosonic bonding of gold wire onto a copper pad with titanium thin-film deposition," Journal of Electronic Materials 33(4), pp. 290-299, Apr. 2004.*

* cited by examiner

SEMICONDUCTOR MODULE BONDING WIRE CONNECTION METHOD

BACKGROUND

This application claims priority to German Patent Application No. 10 2014 106 763.0 filed on 14 May 2014, the content said application incorporated herein by reference in its entirety.

In electronic modules, electronic components are often connected to a circuit carrier by sintered connecting layers. If the connecting process required therefor leads to contamination of a surface on which a further joining process is subsequently to be effectuated, this can impair the quality of the connection produced in such a further joining process. By way of example, the strength of the joined layers in question and/or the long-term stability thereof can be reduced. The contamination may involve, for example, residues, constituents or reaction products of a paste required for producing the sintered connecting layer and/or of an auxiliary agent required for producing the sintered connecting layer, and/or residues, constituents or reaction products from the atmospheric surroundings which are present during the connecting process.

SUMMARY

Embodiments described herein provide a method for producing an electronic module, in which a high-quality joint can be produced between a subassembly, for the production of which a first joining partner has been connected to a circuit carrier by a sintering method, and a second joining partner.

According to an embodiment, a method for producing an electronic module is disclosed. The method includes providing a subassembly having a circuit carrier with a first metallic surface portion and a first joining partner, which is integrally connected to the first metallic surface portion by means of a first connecting layer. Moreover, the subassembly has a second metallic surface portion. A second joining partner is provided. A heat treatment is carried out in which the second metallic surface portion is held uninterruptedly at temperatures which are higher than a minimum heat-treatment temperature of at least 300° C. A fixed connection is produced between the second joining partner and the subassembly such that the second joining partner is integrally connected to the subassembly following completion of the heat treatment on the second surface portion.

BRIEF DESCRIPTION OF THE DRAWINGS

The invention will be explained herein below on the basis of exemplary embodiments with reference to the attached figures, in which.

Unless stated otherwise, the same reference signs in the figures denote elements which are the same or have the same action.

DETAILED DESCRIPTION OF THE DRAWINGS

Figure 1:
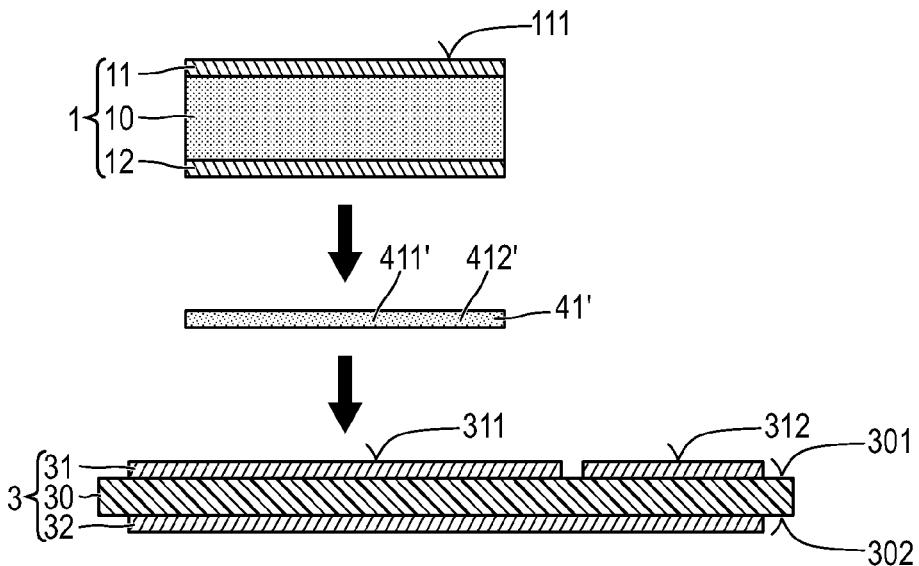
FIG. 1 shows an intermediate step of a method for producing a subassembly, in which a circuit carrier is integrally connected to a first joining partner, according to an embodiment.

FIG. 1 shows a circuit carrier 3 and also a first joining partner 1 to be connected to the circuit carrier 3. The first joining partner 1 may be any desired component, for example an electronic component (e.g. a MOSFET, an IGBT, a thyristor, a JFET, a diode, etc.), or any other desired active or passive component or any desired electronic subassembly or an electrically conductive (e.g. metallic) connection element.

The circuit carrier 3 has a dielectric insulation carrier 30, for example a ceramic, with a top side 301, to which an upper metallization layer 31 is applied. As is shown, the upper metallization layer 31 can be structured or alternatively unstructured. The bottom side 302 of the insulation carrier 30, which is opposite to the top side 301, can optionally also be provided with a lower metallization layer 32. This can be structured or unstructured, irrespective of the embodiment of the upper metallization layer 31. If a lower metallization layer 32 is present, it can optionally be electrically insulated with respect to the upper metallization layer 31.

In principle, the configuration of the circuit carrier 3 may vary. In particular, it does not necessarily have to include an insulation carrier 30. In any case, however, it has a first metallic surface portion 311, at which the first joining partner 1 is integrally connected to the circuit carrier 3 by means of a first connecting layer 41, which is shown as a result in FIG. 2. For this purpose, the first joining partner 1 can have, for example, a lower metallization layer 12. By way of example, the first connecting layer 41 can be a sintered layer or a solder layer.

If the first connecting layer 41 is a sintered layer, it is produced by means of a paste 41', which is shown in FIG. 1 and which contains a metal powder 411' and a solvent 412'. This paste 41' is arranged between the first metallic surface portion 311 and the lower metallization layer 12 of the first joining partner 1 in such a manner that it extends continuously between the lower metallization layer 12 of the first joining partner 1 and the first metallic surface portion 311. For this purpose, the paste 41' can be applied initially to the first metallic surface portion 311 and/or to the first metallic surface portion 311. After the application, the first joining partner 1 and the circuit carrier 3 can be joined together.

In the state in which the paste 41' extends continuously between the first metallic surface portion 311 and the lower metallization layer 12 of the first joining partner 1, the paste 41' is sintered to form a solid first connecting layer 41, which integrally connects the first joining partner 1 and the circuit carrier 3 to one another. This results in a subassembly 99, as is shown by way of example in FIG. 2.

After the application and before the sintering, the paste 41' can optionally also be at least partially dried, such that the majority of the solvent 412' escapes and a dried layer consisting predominantly of the metal powder 411' remains.

The subassembly 99 has one or more second metallic surface portions, at which it can be integrally connected to a second joining partner. By way of example, such a second surface portion may be a surface portion 111 of an upper metallization layer 11 of the first joining partner 1 and/or a surface portion of a metallization of the circuit carrier 3, for example a surface portion 312 of the upper metallization layer 31 of the circuit carrier 3.

Figure 2:
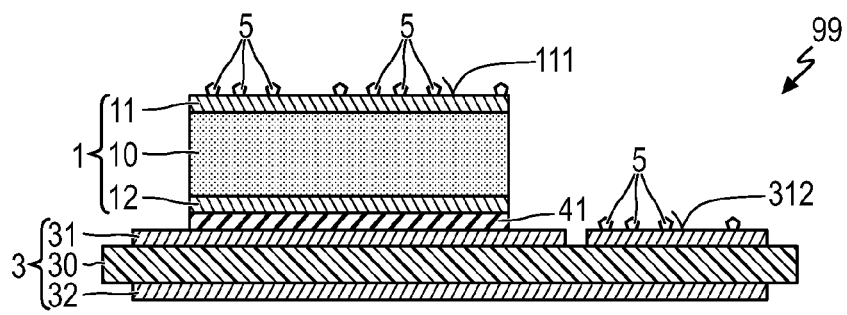
FIG. 2 shows a finished subassembly, according to an embodiment.

As is shown schematically in FIG. 2, the second metallic surface portion or surface portions 111, 312 can be contaminated with contaminations 5. In order to remove these contaminations 5 at least partially and ideally entirely from one or more of the second metallic surface portions 111, 312, at least the second metallic surface portions 111, 312 in question are subjected to a heat treatment, in which they are held uninterruptedly at temperatures which are higher than a minimum heat-treatment temperature of at least 300° C. The duration of the heat treatment can in principle be selected as desired. By way of example, the duration can be at least one second.

It is optionally the case that not only the second metallic surface portion or surface portions 111, 312 but also the entire subassembly 99 can be subjected to the heat treatment. This means that, during the heat treatment, every point of the subassembly 99 is held uninterruptedly at temperatures which are higher than the minimum heat-treatment temperature.

It is likewise optionally possible for the minimum heat-treatment temperature to be not only at least 300° C., but even at least 350° C. or even at least 355° C.

Figure 3:
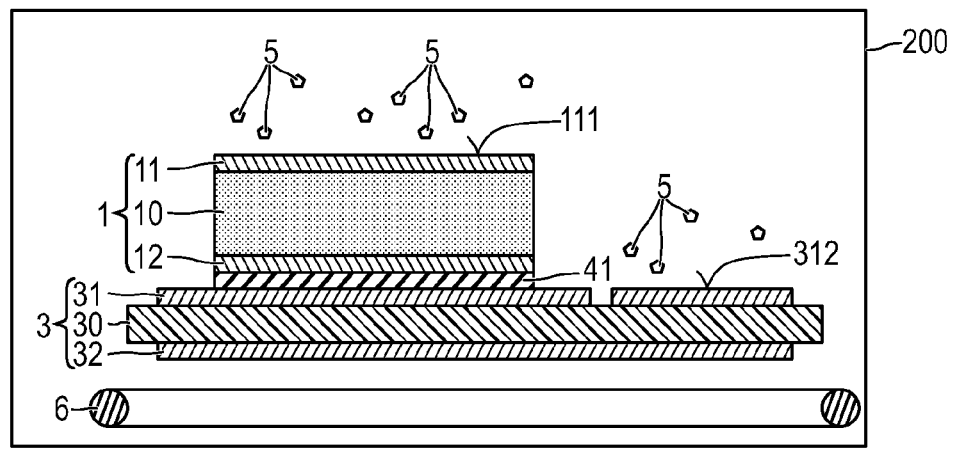
FIG. 3 shows the subassembly during the heat treatment, according to an embodiment.

In order to heat the second metallic surface portions 111, 312 or even the entire subassembly 99 for the purposes of the heat treatment, it is possible to use in principle any desired heating methods. One possibility which is shown in FIG. 3 consists, for example, in heating metallic component parts of the subassembly 99, for example the metallizations 11, 31, which form the second metallic surface portion or surface portions 111, 312 (where present), by means of an inductor 6. In alternative methods for heating, use can be made, for example, of a heating plate, hot air, a hot-air blower, infrared thermal radiation, laser radiation or a plasma beam.

In all variants, the heating can be effectuated in such a way that no metallic component part of the subassembly 99 is melted during the heat treatment.

Irrespective of the heating method, the heat treatment has the effect that the contaminations 5 at least partially evaporate and escape into the atmosphere surrounding the subassembly 99.

The heat treatment can optionally be carried out in a chamber 200, which is likewise shown in FIG. 3 and into the atmosphere of which the contaminations 5 escape as a result of the heat treatment.

Figure 4:
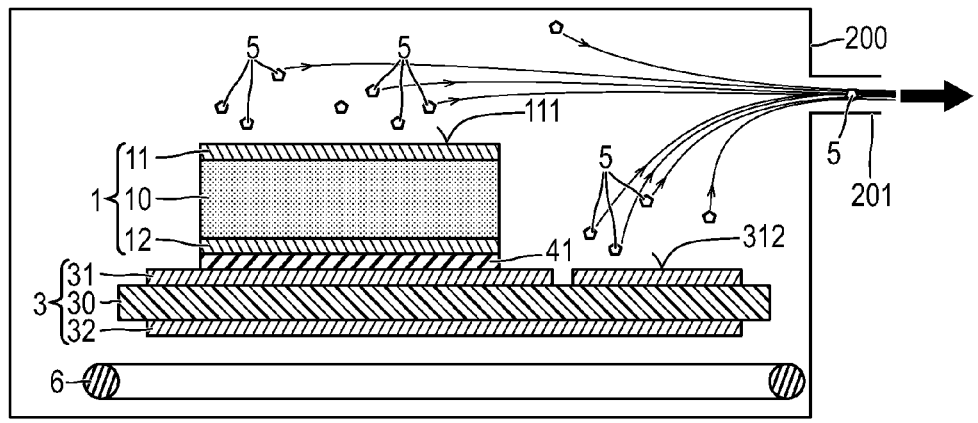
FIG. 4 shows the subassembly during the optional suction removal of the atmosphere which surrounds the subassembly, which follows the heat treatment, according to an embodiment.

As is furthermore shown in FIG. 4, an atmosphere of a chamber 200 which is enriched in this way with contaminations 5 can optionally be removed at least partially by suction from the chamber 200 after the heat treatment, in that the chamber 200 is evacuated in order to remove the contaminations 5 present in the chamber atmosphere—ideally entirely—from the chamber 200, this being shown in FIG. 4 on the basis of a plurality of arrows. For this purpose, the chamber 200 can have a suction removal opening 201. The suction removal can be effected, for example, by means of a vacuum pump connected to the suction removal opening.

According to a further optional embodiment, the heat treatment can be carried out in a protective gas atmosphere which prevents the oxidation of the second surface portion 111, 312. In principle, any desired protective gases or protective gas mixtures can be used. A cost-effective protective gas is, for example, nitrogen.

It is likewise optionally possible to carry out the heat treatment in a reducing atmosphere. It is thereby possible to eliminate metal oxides which are possibly present on the second metallic surface or metallic surfaces 111, 312. Suitable substances of such a reducing atmosphere are, for example, formic acid and/or hydrogen and/or forming gas.

Irrespective of whether the heat treatment is carried out in a chamber 200, whether a protective gas atmosphere is used, whether a reducing atmosphere is used and whether suction removal is effected, the heat-treated subassembly 99 is integrally connected to a second joining partner on at least one second metallic surface portion 111, 312 (cleaned by the heat treatment).

In principle, the second joining partner may be any desired component, for example an active or a passive electronic component, or an electrical connecting line such as, for example, a bonding wire, or a flat or bent connecting sheet.

Figure 5A:
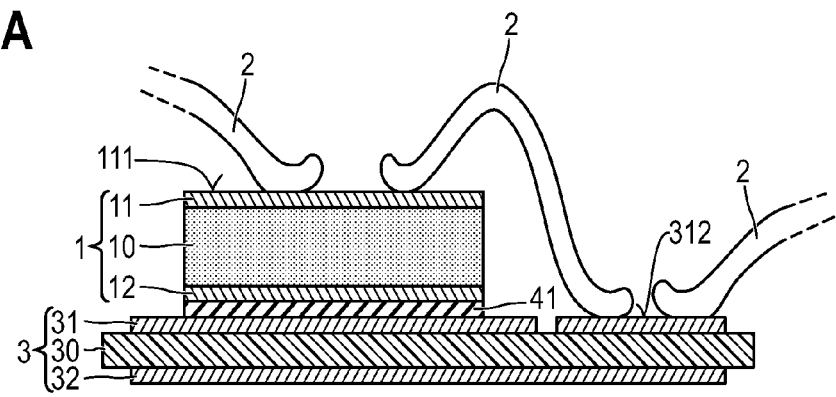
FIG. 5A shows an electronic module, for the production of which a second joining partner has been directly and integrally connected to the subassembly shown in FIG. 2 after said subassembly has been heat-treated, according to an embodiment.

With reference to FIG. 5A, the following description explains, by way of example, the connection of a second joining partner 2 in the form of bonding wire to a second metallic surface portion 111, 312 (cleaned by the heat treatment). In this case, the bonding wire is connected directly to the second metallic surface portion 111, 312 in a manner known per se by a wire bonding technique, for example by ultrasonic bonding. In this context, bonding wires are considered to be both wires which have a circular cross section (before the wire bonding) and also wires which do not have a circular cross section (before the wire bonding).

The bonding wire 2 shown on the left in FIG. 5A was bonded to the second metallic surface portion 111 at a first bonding location by wire bonding, for example by ultrasonic bonding. Correspondingly, the bonding wire 2 shown on the right in FIG. 5A was bonded to the second metallic surface portion 312 at a first bonding location by wire bonding, for example by ultrasonic bonding. The bonding wire 2 on the left and the bonding wire 2 on the right can also be bonded at one or more further bonding locations to other elements which are not a fixed component part of the subassembly 99. The bonding wire 2 shown in the center in FIG. 5A was bonded to the second metallic surface portion 111 at a first bonding location by wire bonding, for example by ultrasonic bonding, and to the second metallic surface portion 312 at a second bonding location, likewise by wire bonding, for example by ultrasonic bonding.

The illustration shown in FIG. 5A is only schematic in so far as three bonding wires 2 do not necessarily have to be present. If in the case of the present invention a second joining partner 2 is in the form of bonding wire, it is bonded at at least one bonding location directly to a second metallic surface portion cleaned during a preceding heat treatment, for example to the second metallic surface portion 111 or 312. In any case, the second joining partner 2 in the form of bonding wire makes contact with the second surface portion at this bonding location.

Figure 5B:
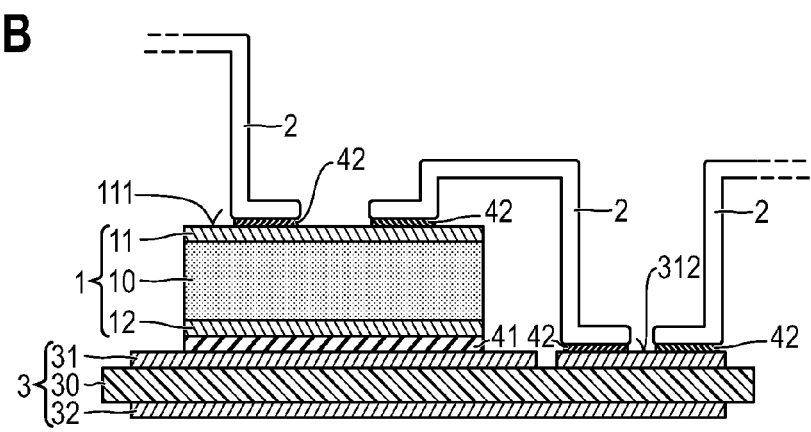
FIG. 5B shows an electronic module, for the production of which a second joining partner has been integrally connected to the subassembly shown in FIG. 2 by means of a connecting layer after said subassembly has been heat-treated, according to an embodiment.

As is furthermore shown in FIG. 5B, a second joining partner 2 does not necessarily have to be fastened directly to the second metallic surface portion 111 or 312 in order to be fastened to the subassembly 99 (cleaned by the heat treatment). Instead, as is shown in FIG. 5B, this can also be effectuated by means of a second connecting layer 42, which extends continuously between the second joining partner 2 and the associated second surface portion 111, 312. A second connecting layer 42 of this type can be electrically conductive (it may include, for example, metal or consist of metal) and thereby connect the second joining partner 2 to the associated second surface portion 111, 312 in an electrically conductive manner. This connection can be produced, for example, by soldering (the second connecting layer 42 is then a solder metal), by electrically conductive adhesive bonding (the second connecting layer 42 is then an electrically conductive adhesive), or by sintering (the second connecting layer 42 then contains a sintered metal powder, in a manner corresponding to the first connecting layer 41).

The second joining partners 2 shown in FIG. 5B are in each case a metal sheet. The metal sheet 2 shown on the left in FIG. 5B was connected to the second metallic surface portion 111 at a first location by means of a second connecting layer 42. Correspondingly, the metal sheet 2 shown on the right in FIG. 5B was connected to the second metallic surface portion 312 at a first location by means of a second connecting layer 42. The metal sheet 2 on the left and the metal sheet 2 on the right can also be connected at one or more further locations to other elements which are not a fixed component part of the subassembly 99. The metal sheet 2 shown in the center in FIG. 5B was connected to the second metallic surface portion 111 at a first location by means of a second connecting layer 42, and to the second metallic surface portion 312 at a second location.

The illustration shown in FIG. 5B is only schematic in so far as all three metal sheets 2 do not necessarily have to be present. If in the case of the present invention a second joining partner 2 (e.g., a metal sheet) is connected to the subassembly 99 at a second metallic surface portion 111, 312 by means of a second (optionally electrically conductive) connecting layer 42, this second connecting layer 42 extends continuously between the second joining partner 2 and the associated second metallic surface portion 111, 312.

A second joining partner 2 (for example a bonding wire or a metal sheet as explained above) can consist, for example, of metal, for example of aluminum, of an aluminum alloy, of copper or of a copper alloy. If the second joining partner 2 is in the form of bonding wire consisting of copper, the copper can optionally have a purity of at least 99%.

The second metallic surface portion 111, 312 can likewise consist of metal, for example of aluminum, of an aluminum alloy, of copper or of a copper alloy. If the second surface portion 111, 312 comprises copper, the copper content thereof can optionally be at least 90% by weight.

The heat treatment explained in the present case makes it possible to dispense with cleaning of the subassembly 99 by means of wet chemistry and/or by means of a plasma process after the production of the solid first connecting layer 41 and before the second joining partner 2 is connected to the subassembly 99. However, such cleaning can optionally nevertheless be carried out.

Figure 6:
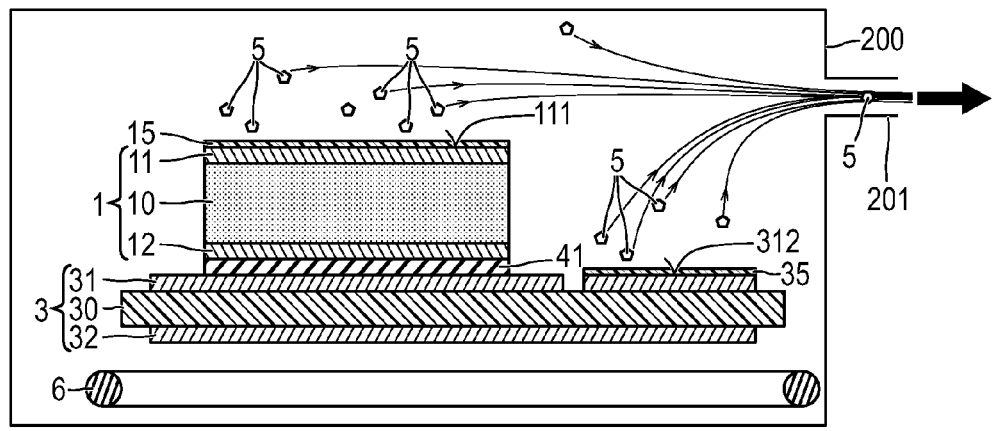
FIG. 6 shows a subassembly, in which the second metallic surface portion is provided with an oxidation-resistant layer, during the heat treatment, according to an embodiment.

FIG. 6 also shows the heat treatment of a subassembly 99, the latter differing from the subassembly 99 explained on the basis of FIGS. 1 to 4 merely in that an oxidation-resistant layer 15 or 35 is applied to at least one second metallic surface portion 111, 312. Such an oxidation-resistant layer 15, 35 prevents oxidation of the second metallic surface portion 111, 312 in question. Since a contamination 5 of such an oxidation-resistant layer 15, 35 can also have a disadvantageous effect on a subsequent integral connection to a second joining partner 2, the heat treatment is carried out on the subassembly 99 provided with the oxidation-resistant layer or layers 15, 35. Irrespective of possible other oxidation-resistant layers 15, 35, such an oxidation-resistant layer 15, 35 can be applied to the second metallic surface portion 111, 312 in question before or after the integral connection between the first joining partner 1 and the circuit carrier 3. The heat treatment of such a subassembly 99 can otherwise be effectuated in the same manner as the heat treatment, explained with reference to FIGS. 1 to 4, of the subassembly 99 explained in said FIGS. 1 to 4.

Figure 7:
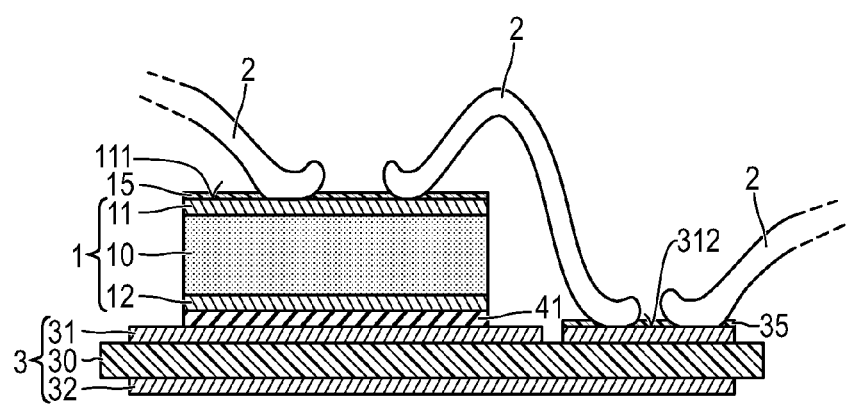
FIG. 7 shows an electronic module, for the production of which a second joining partner has been directly and integrally connected to the subassembly shown in FIG. 6 after said subassembly has been heat-treated, according to an embodiment.

FIG. 7 shows an electronic module, the structure of which corresponds to the structure of the electronic module shown in FIG. 5A, apart from the additional oxidation-resistant layer or layers 15, 35. An electronic module of this type can be produced in the same way as has been explained with reference to FIG. 5A. In addition thereto, the direct integral connection between a second joining partner 2 in the form of bonding wire and a second metallic surface portion 111, 312 is produced in that, during the bonding operation, that is for example ultrasonic bonding, the oxidation-resistant layer 15, 35 located on the second metallic surface portion 111, 312 in question is locally destroyed during the bonding operation on account of the action of the second joining partner 2, such that the second joining partner 2 makes direct contact with said second metallic surface portion 111, 312 and is integrally connected thereto.

An extremely wide variety of materials are suitable in principle for such oxidation-resistant layers 15, 35, for example aluminum oxide, silicon nitride, silicon oxide.

The invention claimed is:

1. A method for producing an electronic module, comprising:
providing a subassembly, comprising: a circuit carrier with a first metallic surface portion; a first joining partner, which is integrally connected to the first metallic surface portion by means of a first connecting layer; and a second metallic surface portion;
performing a decontamination process while the second metallic surface portion is completely exposed in which contaminations are removed from the exposed second metallic surface portion, the decontamination process comprising holding the exposed second metallic surface portion uninterruptedly at temperatures which are higher than a minimum heat-treatment temperature of at least 300° C.;
providing a second joining partner; and
producing a fixed connection between the second joining partner and the subassembly such that the second joining partner is integrally connected to the subassembly following completion of the decontamination process on the second surface portion.

2. The method as claimed in claim 1, wherein, during the decontamination process, the entire subassembly is held uninterruptedly at temperatures which are higher than the minimum heat-treatment temperature.

3. The method as claimed in claim 1, wherein the decontamination process is carried out in a protective gas atmosphere which prevents the oxidation of the second surface portion.

4. The method as claimed in claim 1, wherein the decontamination process is carried out in a reducing atmosphere.

5. The method as claimed in claim 4, wherein the reducing atmosphere comprises one of the following gases: formic acid; hydrogen; forming gas.

6. The method as claimed in claim 1, wherein the decontamination process is carried out in a closed chamber that is evacuated after the heat treatment decontamination process.

7. The method as claimed in claim 1, wherein the minimum heat-treatment temperature is 350° C.

8. The method as claimed in claim 1, wherein the second joining partner comprises copper with a purity of at least 99%.

9. The method as claimed in claim 1, wherein the second surface portion is a surface portion of a metallization layer which comprises copper or which comprises at least 90% by weight copper.

10. The method as claimed in claim 1, wherein the second surface portion is a surface portion of a metallization of the first joining partner.

11. The method as claimed in claim 1, wherein the second surface portion is a surface portion of the circuit carrier.

12. The method as claimed in claim 1, wherein
the circuit carrier has a dielectric insulation carrier, to which an upper metallization layer is applied; and
wherein the first surface portion is a surface portion of the upper metallization layer.

13. The method as claimed in claim 1, wherein the first joining partner is an electronic component.

14. The method of claim 1, wherein the second joining partner is in the form of bonding wire or of flat or angled metal sheet.

15. The method as claimed of claim 1, wherein the second joining partner is in the form of bonding wire, wherein, during the decontamination process, an oxidation-resistant layer is applied to the second surface portion, and wherein the oxidation-resistant layer is locally destroyed by the action of the second joining partner during the production of the fixed connection between the second joining partner and the subassembly.

16. The method of claim 1, wherein no metallic component part of the subassembly is soldered or sintered during the decontamination process.

17. The method of claim 1, wherein the first connecting layer comprises a sintered metal powder.

18. The method of claim 1, wherein the fixed connection is produced by virtue of the fact that:
(a) the second joining partner is bonded directly to the second surface portion; or
(b) the second joining partner is fixedly connected to the subassembly by means of a second connecting layer in such a manner that the second connecting layer extends continuously between the second surface portion and the second joining partner.

19. The method of claim 1, wherein the providing the subassembly comprises:
providing the circuit carrier which has the first metallic surface portion;
providing the first joining partner which has a lower metallization layer;
providing a paste which contains a metal powder;
arranging the paste between the first metallic surface portion and the lower metallization layer in such a manner that the paste extends continuously between the first metallic surface portion and the lower metallization layer; and
sintering the paste to form a solid connecting layer, which integrally connects the first joining partner and the circuit carrier to one another.

20. The method as claimed in claim 1, wherein producing the fixed connection between the second joining partner and the subassembly comprises initially contacting the second joining partner with the exposed second metallic surface portion following completion of the decontamination process on the second surface portion.

* * * * *